(12) United States Patent
Yamaguchi

(10) Patent No.: US 7,550,732 B2
(45) Date of Patent: Jun. 23, 2009

(54) RADIATION IMAGE DETECTOR

(75) Inventor: Akira Yamaguchi, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 646 days.

(21) Appl. No.: 11/238,010

(22) Filed: Sep. 29, 2005

(65) Prior Publication Data

US 2006/0065813 A1    Mar. 30, 2006

(30) Foreign Application Priority Data

Sep. 30, 2004   (JP)   ............................ 2004-287318
Sep. 30, 2004   (JP)   ............................ 2004-287319

(51) Int. Cl.
*H01L 27/146* (2006.01)
*H01L 27/00* (2006.01)

(52) U.S. Cl. .................. 250/370.09; 250/208.1

(58) Field of Classification Search ............ 250/370.09, 250/336.1, 208.1; 341/155; 348/245; 378/97, 378/98.8
See application file for complete search history.

(56) References Cited

U.S. PATENT DOCUMENTS 6,696,687 B1 * 2/2004 Tomisaki et al. ....... 250/370.09

2002/0050940 A1 * 5/2002 Sato et al. .................... 341/155
2004/0056204 A1 3/2004 Tanaka et al.

\* cited by examiner

*Primary Examiner*—David P Porta
*Assistant Examiner*—Faye Boosalis
(74) *Attorney, Agent, or Firm*—Sughrue Mion, PLLC

(57) ABSTRACT

A TFT readout system radiation image detector capable of satisfactorily removing noise signals generated by the parasitic capacitors formed in the vicinity of the respective intersections between gate control signal lines and charge signal lines. The detector includes charge detecting elements for storing charges generated by receiving radiation; gate control signal lines through which a gate control signal flows to control the switching element of each charge detecting element; charge signal lines to which charge signals stored in the storage sections flow out; and delay circuits provided for the switching elements of respective charge detecting elements to delay the rise time of the gate control signal. Charge signals flowed out to the charge signal lines after the rise time are detected to differentiate the detection timings of the charge signals, and noise signals generated a when outputting of the gate control signal is initiated.

10 Claims, 5 Drawing Sheets

RADIATION IMAGE DETECTOR

BACKGROUND OF THE INVENTION

1. Field of the Invention

The present invention relates to a radiation image detector in which charges of a radiation image are generated and stored by receiving radiation carrying the radiation image, and the charges stored in the detector are detected as image signals.

2. Description of the Related Art

Various types of radiation image detectors are proposed and put into practical use in the medical and other industrial fields. In such a detector, a radiation image of a subject is recorded by receiving radiation transmitted through the subject, and the image recorded on the detector is detected by reading out the image signals in accordance with the image recorded on the detector.

Some of the radiation image detectors use, for example, a semiconductor material that generates charges when exposed to radiation, and some of them use a so-called TFT readout system.

One such TFT readout system radiation image detector includes, for example, a radiation image recording medium, which is a layer composite of a charge generating layer for generating charges by receiving radiation, and a charge detecting layer for storing the charges generated in the charge generating layer; and a detecting section having charge amplifiers for detecting charge signals flowed out from the radiation image recording medium and the like.

More specifically, the charge detecting layer of the radiation image recording medium includes multitudes of charge detecting elements disposed two-dimensionally in orthogonal directions, each having a storage section for storing the charge generated in the charge generating layer and a TFT switching element. The charge detecting layer further includes multitudes of charge signal lines, each being installed in parallel with each column of the charge detecting elements; and multitudes of gate control signal lines, each being installed in parallel with each row of the charge detecting elements and orthogonally to each of the charge signal lines.

When recording a radiation image using the radiation image detector constructed in the manner as described above, the radiation image is recorded by irradiating radiation carrying the image on the charge generating layer, and storing the charges generated in the charge generating layer in the storage sections of the charge detecting layer. When reading out the radiation image, a gate control signal is outputted to the gate control signal lines selectively from a gate driver, and the TFT switching elements of the charge detecting elements connected to the gate control signal line are switched to ON according to the gate control signal, and charge signals start to flow out to the charge signal lines from the storage sections of the activated charge detecting elements. The charge signals flowed out to the charge signal lines are detected as image signals through charge amplifiers and the like. In this way, the radiation image is read out.

Here, in the radiation image detector described above, the gate control signal lines and charge signal lines are disposed orthogonally to each other with an insulation layer between them. Consequently, a parasitic capacitor is formed between each of the gate control signal lines and each of the charge signal lines in the vicinity of the intersection. When the gate control signal flows through one of the gate control signal lines in the reading process for reading out the radiation image as described above, a potential difference is developed between the gate control signal line and each of the charge signal lines, and charges are stored in the parasitic capacitors. Then the charges stored in the parasitic capacitors flow out to the charge signal lines as noise signals and included in the charge signals flowed out from the storage sections of the charge detecting elements.

Under the circumstances described above, one method for eliminating the noise signals is proposed as described, for example, in U.S. Patent Application Publication No. 20040056204. In the method, noise compensation signal lines are provided orthogonally to the charge signal lines with an insulation layer between them, in addition to the gate control signal lines. Further, TFT switching elements, each connected to each of the noise compensation signal lines and each of the charge signal lines, and dummy capacitors, each connected to each of the TFT switching elements are also provided. When outputting the gate control signal to one of the gate control signal lines, a signal having an opposite polarity to that of the gate control signal is also outputted to the corresponding noise compensation signal line to generate a noise compensation signal in the vicinity of each intersection between each of the charge signal lines and the noise compensation signal line in accordance with the reverse polarity signal, and store it in each of the dummy capacitors, then the noise compensation signals stored in the dummy capacitors are outputted to the charge signal lines through the TFT switching elements to eliminate the noise signals.

However, each of the noise compensation signal lines described in U.S. Patent Application Publication No. 20040056204 is installed in a place which is different from the place where each of the gate control signal lines is installed. The insulation layer installed between the gate control signal lines and charge signal lines, and that installed between the noise compensation signal lines and charge signal lines have different thickness variations with each other. Consequently, each parasitic capacitor formed in the vicinity of the intersection between each of the gate control signal lines and each of the charge signal lines, and that formed in the vicinity of the intersection between each of the noise compensation signal lines and each of the charge signal lines may differ in the capacitance value. Accordingly, the noise signals and noise compensation signals may differ in magnitude and the noise may not be eliminated properly, resulting in the residual noise being included in the charge signals.

SUMMARY OF THE INVENTION

In view of the circumstances described above, it is an object of the present invention to provide a TFT readout system radiation image detector capable of satisfactorily eliminating the noise signals generated by the parasitic capacitors described above.

A first radiation image detector of the present invention comprises:

(a) a radiation image recording medium, including:
 (1) a charge generating section for generating charges by receiving radiation carrying a radiation image;
 (2) multitudes of charge detecting elements disposed two-dimensionally in orthogonal directions, each having a storage section for storing the charge generated in the charge generating section, and a switching element for reading out the charge signal stored in the storage section;
 (3) multitudes of charge signal lines for receiving the charge signals flowing out from the storage sections, each of the charge signal lines being installed in parallel with each column of the charge detecting elements disposed in either direction of the orthogonal directions;

(4) multitudes of gate control signal lines for receiving a gate control signal for controlling the switching elements ON and OFF, each of the gate control signal lines being installed in parallel with each row of the charge detecting elements disposed in the other direction of the orthogonal directions; and (b) a detecting section for detecting the charge signals flowed out to the charge signal lines of the radiation image recording medium, wherein:

the radiation image recording medium further includes multitudes of delay circuits, each being provided for the switching element of each of the charge detecting elements, for delaying the rise time of the gate control signal for causing each of the switching elements to be switched to ON; and the detecting section is constructed to detect the charge signals flowed out to the charge signal lines after the rise time.

In the first radiation image detector of the present invention, the delay circuit may be configured by a low-pass filter circuit.

Further, the detecting section may include:

a charge amplifier for integrating the charge signal flowed out to the charge signal line; and a correlated double sampling control section which is constructed:

to control the charge amplifier to initiate the integration after the gate control signal is outputted to the gate control signal line and before the end of the rise time;

to obtain a first signal which has been integrated by the charge amplifier during the time period from the initiation of the integration to a predetermined time point which is before the end of the rise time;

to obtain a second signal which has been integrated by the charge amplifier during the time period from the initiation of the integration to a time point which is just before the end of a predetermined integration time; and to obtain the difference between the second and first signals as an image signal of the radiation image.

Here, in the first radiation image detector of the present invention, the referent of "rise time" means a time period from the time when the gate control signal is applied to the switching element to the time when the switching element is switched to ON. The referent of "delaying the rise time" means to give a predetermined time constant to the gate control signal at its rising edge.

A second radiation image detector of the present invention comprises:

(a) a radiation image recording medium, including:

(1) a charge generating section for generating charges by receiving radiation carrying a radiation image;

(2) multitudes of charge detecting elements disposed two-dimensionally in orthogonal directions, each having a storage section for storing the charge generated in the charge generating section, and a switching element for reading out the charge signal stored in the storage section;

(3) multitudes of charge signal lines for receiving the charge signals flowing out from the storage sections, each of the charge signal lines being installed in parallel with each column of the charge detecting elements disposed in either direction of the orthogonal directions;

(4) multitudes of gate control signal lines for receiving a gate control signal for controlling the switching elements ON and OFF, each of the gate control signal lines being installed in parallel with each row of the charge detecting elements disposed in the other direction of the orthogonal directions; and (b) a detecting section, including:

(1) a gate control signal output section for outputting the gate control signal to the gate control signal lines; and (2) a charge amplifier for detecting an image signal of the radiation image by integrating the charge signal flowed out to the charge signal line; and (c) a noise compensation signal output section for outputting to each of the gate control signal lines a reverse voltage signal having an opposite voltage direction to that of the gate control signal for causing the switching elements to be switched to ON within the integration time for integrating the charge signal by the charge amplifier.

In the second radiation image detector of the present invention, the gate control signal output section may be used as the noise compensation signal output section, and the reverse voltage signal may be outputted from the gate control signal output section.

Further, the second radiation image detector of the present invention may further include a correlated double sampling control section constructed:

to obtain a first signal which has been integrated by the charge amplifier during the time period from the initiation of the integration by the charge amplifier to a first time point which is before the gate control signal for causing the switching element to be switched to ON is outputted;

to obtain a second signal which has been integrated by the charge amplifier during the time period from the initiation of the integration by the charge amplifier to a second time point which is after the reverse voltage signal is outputted and within the integration time; and to obtain the difference between the second and first signals as the image signal.

Here, in the second radiation image detector of the present invention, the referent of "voltage direction of the gate control signal for causing the switching elements to be switched to ON" means, for example, the rising direction if the switching elements are switched to ON by the rising edge of the voltage, or the falling direction if the switching elements are switched to ON by the falling edge of the voltage. The referent of "reverse voltage signal" means, for example, a voltage signal having the falling edge if the switching elements are switched to ON by the rising edge of the voltage, or a voltage signal having the rising edge if the switching elements are switched to ON by the falling edge of the voltage.

Further, the gate control signal for causing the switching elements to be switched to OFF may be used as the "reverse voltage signal".

In the first and second radiation image detectors, the referent of "column" and "row" are used for distinguishing the two orthogonal directions, and they do not necessarily mean a particular direction, such as the horizontal or vertical direction.

According to the first radiation image detector of the present invention, a delay circuit is provided for the switching element of each of the charge detecting elements to delay the rise time of the gate control signal, and the charge signals flowed out to the charge signal lines after the rise time are detected. This allows the noise signals generated by the parasitic capacitors when outputting of the gate control signal is initiated to the gate control signal lines, and charge signals stored in the storage sections of the charge detecting elements to flow through the charge signal lines at different timings. Accordingly, charge signals free from the noise signals may be detected.

Further, in the first radiation image detector of the present invention, when a low-pass filter is used as the delay circuit, the delay circuit may be composed, for example, by an inexpensive CR circuit made of a resistance element and a capacitor.

According to the second radiation image detector of the present invention, a reverse voltage signal having an opposite voltage direction to that of the gate control signal for causing the switching elements to be switched to ON is outputted to each gate control signal line within the integration time of the charge signal by the charge amplifier. This allows the noise compensation signal having the opposite polarity to that of the noise signal to be generated in the parasitic capacitor according to the reverse voltage signal. The noise compensation signal having the opposite polarity to that of the noise signal may also be integrated by the differential amplifier, so that the noise signals generated when outputting of the gate control signal is initiated may be eliminated satisfactorily by the noise compensation signals having the opposite polarity to that of the noise signals without being affected by the variations in thickness of the insulation layers described earlier.

Further, in the second radiation image detector of the present invention, if the gate control signal output section is used as the noise compensation signal output section, and the reverse voltage signal is outputted from the gate control signal output section, an inexpensive noise compensation signal output section may be constructed easily compared with the method described, for example, in U.S. Patent Application Publication No. 20040056204, in which an additional gate driver is provided separately.

DESCRIPTION OF THE PREFERRED EMBODIMENTS

Hereinafter, a first embodiment of the radiation image detector of the present invention will be described with reference to the accompanying drawings.

Figure 1:
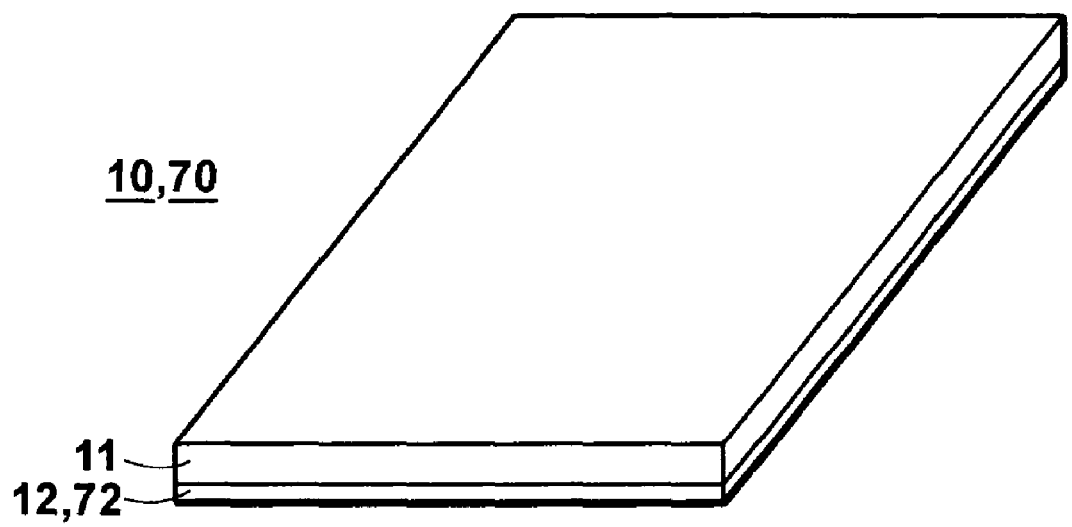
FIG. 1 is a perspective view of the radiation image recording medium according to first and second embodiments of the radiation image detector of the present invention.

The radiation image detector according to the first embodiment includes a radiation image recording medium 10 having a charge generating layer 11 for generating charges by receiving radiation, and a charge detecting layer 12 for storing the charges generated in the charge generating layer 11 as shown in FIG. 1; and a detecting section 20, which will be described later, for detecting charge signals flowed out from the radiation image recording medium 10.

The charge generating layer 11 may be made of any material as long as it is capable of generating charges when exposed to radiation. Preferably, however, it is made of, for example, a-Se or the like which has high quantum efficiency and a less amount of dark current. Alternatively, the charge generating layer 11 may be a two-layer composite of a phosphor layer that emits fluorescent light when exposed to radiation, and a photoconductive layer that generates charges when exposed to the fluorescent light emitted from the phosphor layer.

Figure 2:
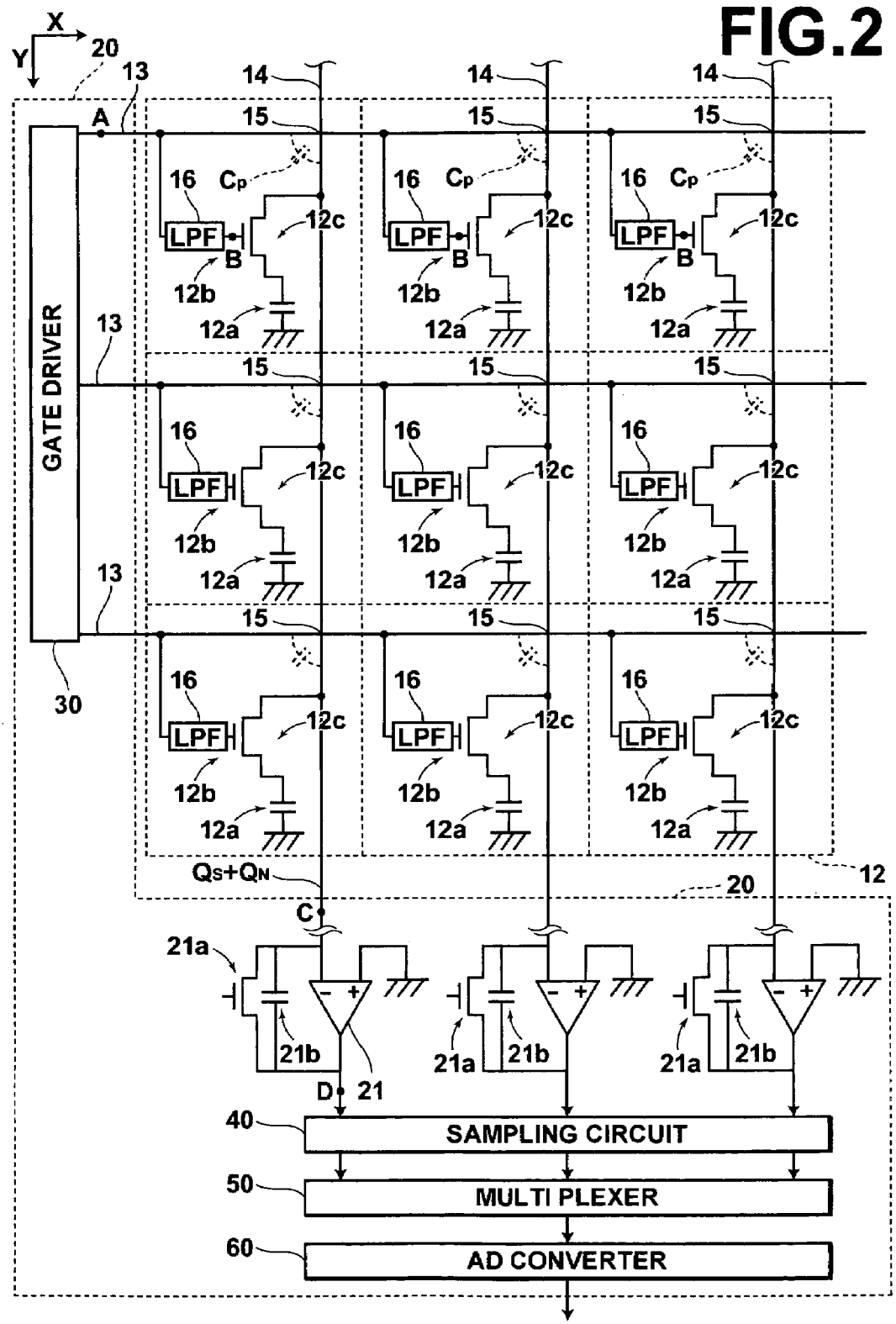
FIG. 2 is a schematic diagram of the detecting section and the charge detecting layer of the radiation image recording medium according to the first embodiment of the radiation image detector of the present invention, illustrating the configuration thereof.

More specifically, the charge detecting section 12 includes multitudes of charge detecting elements 12c disposed two-dimensionally in the orthogonal directions, each having a storage section 12a for storing the charge generated in the charge generating layer 11, and a switching element 12b for reading out the charge stored in the storage section 12a as shown in FIG. 2. The storage section 12a is a capacitor and the switching element 12b is a TFT switch.

As shown in FIG. 2, the charge detecting layer 12 further includes multitudes of gate control signal lines 13, each installed in parallel with each row of the charge detecting elements disposed in X direction, and multitudes of charge signal lines 14, each installed in parallel with each column of the charge detecting elements disposed in Y direction. A gate control signal flows through each of the gate control signal lines 13 to cause the switching elements 12b connected thereto to be switched to ON or off. Each of the charge signal lines 14 receives the charge signals stored in and flowed out from the storage sections 12a connected thereto. The gate control signal is outputted from a gate driver to be described later.

Figure 3:
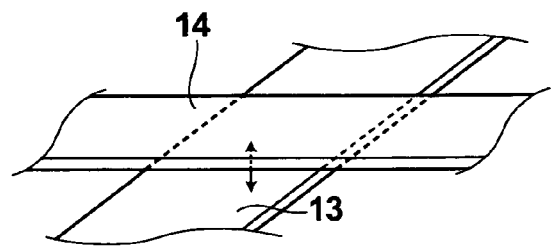
FIG. 3 is a drawing for explaining the arrangement of the gate control signal line and charge signal line.

Each of the gate control signal lines and each of the charge signal lines are installed orthogonally without contacting with each other at the intersection 15. As shown in FIG. 3, a predetermined spacing is provided between them, in which an insulation layer is installed.

Here, the radiation image recording medium 10 according to the present embodiment further includes a delay circuit 16 for each of the charge detecting elements 12c as shown in FIG. 2. The delay circuit 16 is a low-pass filter (LPF) made of a resistance element and a capacitor. The low-pass filter may employ any configuration known in the art. The present embodiment uses a low-pass filter as the delay circuit, but any known circuit in the art may be used as the delay circuit, as long as it is capable of delaying the rise time of the gate control signal. As shown in FIG. 2, the delay circuit 16 is provided at a place other than the intersection between the gate control signal line 13 and charge signal line 14. The operation of the delay circuit 16 will be described later.

The detecting section 20 includes multitudes of differential amplifiers 21, a gate driver 30, a sampling circuit 40, a multiplexer 50, and an AD converter 60.

Each of the differential amplifiers 21 is connected to each of the charge signal lines 14. The differential amplifier 21 is a charge amplifier having a reset switch 21a, and an integration capacitor 21b.

The gate driver 30 outputs the gate control signal to each of the gate control signal lines 13 of the radiation image recording medium 10 selectively and sequentially.

The sampling circuit 40 samples the signals outputted from each of the differential amplifiers 21 at predetermined timings, that is, it performs what is known as the correlated double sampling. The operation of the circuit 40 will be described later.

The multiplexer 50 selectively switches analog image signals outputted from the sampling circuit 40 to output them to the AD converter 60.

The AD converter 60 converts the analog image signals outputted from the multiplexer 50 to digital image signals.

Hereinafter, radiation image recording and reading processes by the radiation image detector according to the first embodiment of the present invention will be described.

When recording a radiation image using the radiation image detector according to the first embodiment, initially, radiation rays transmitted through a subject is irradiated on the detector from the side of the charge generating layer 11 of the radiation image recording medium 10. Then, charge amounts are generated in the charge generating layer 11 in proportion to the amounts of radiation irradiated thereon, which are then stored in the storage sections 12a of the charge detecting layer 12. In this way, the radiation image is stored and recorded.

Figure 4:
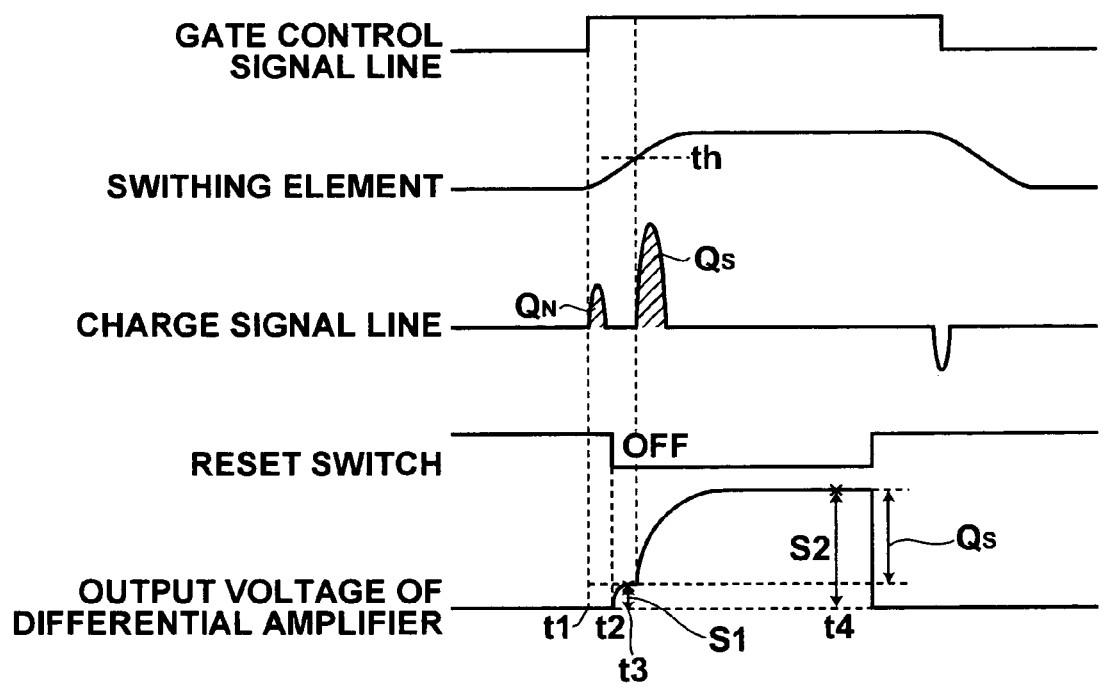
FIG. 4 is a timing chart for explaining the operation of the radiation image detector according to the first embodiment.

Hereinafter, the reading process for reading out the radiation image stored and recorded in the manner as described above will be described with reference to a timing chart shown in FIG. 4. In FIG. 4, the voltage waveform on the gate control signal line is the voltage waveform at point A, and that of the switching element is the voltage waveform at point B in FIG. 2 respectively. The voltage waveform on the charge signal line is the voltage waveform at point C, and that of the output voltage of the differential amplifier is the voltage waveform at point D in FIG. 2 respectively.

When reading out the radiation image, initially, the gate control signal is outputted to one of the gate control signal lines 13 from the gate driver 30 to cause the switching elements 12b connected thereto to be switched to ON as shown in the timing chart in FIG. 4. The gate control signal flowed through the gate control signal line 13 is applied to the switching elements 12b connected thereto. In the radiation image recording medium 10 according to the first embodiment, each of the switching elements 12b has the delay circuit 16 as described earlier, so that the voltage of the gate control signal applied to the gate terminal of each of the switching elements 12b has a time constant at its rising edge, and the rising time is delayed as illustrated in the timing chart shown in FIG. 4.

Thus, at the time point t1 when outputting of the gate control signal to one of the gate control signal lines 13 is initiated from the gate driver 30, each of the switching elements 12b remains switched OFF. In the first embodiment, each of the switching elements 12b is assumed to be switched to ON when the gate terminal voltage reaches the threshold level th as shown in FIG. 4. In the mean time, at the time point t1 when outputting of the gate control signal is initiated to one of the gate control signal lines 13 from the gate driver 30, a noise signal $Q_N$ flows out to the charge signal lines 14 from each of the parasitic capacitors $C_P$ formed in the vicinity of the intersection between the gate control signal line 13 and each of the charge signal lines 14 as described earlier.

Then, at the time point t2 which is after the noise signal $Q_N$ has flowed out to the charge signal line 14 and before the gate terminal voltage reaches the threshold level th, the reset switch 21a of each of the differential amplifiers 21 is switched to OFF to initiate the integration. Then, at the time point t3 which is after the reset switch is switched to OFF and before the gate terminal voltage reaches the threshold level th, the output voltages S1 outputted from the respective differential amplifiers 21 are sampled by the sampling circuit 40. After the output voltages S1 are sampled in the manner as described above, the gate terminal voltage of each of the switching elements 12b reaches the threshold level th, and the switching elements are switched to ON. The time constant of the delay circuit 16 is selected to allow the aforementioned timing sequence to take place.

When each of the switching elements 12b is switched to ON, the charge signals $Q_S$ stored in the storage sections 12a of the charge detecting elements 12c are outputted to the respective charge signal lines 14 connected to the respective storage sections 12a.

The charge signals $Q_S$ flowed out to the charge signal lines 14 in the manner as described above are inputted to the differential amplifiers 21 from the inverting input terminal and integrated therein. Thereafter, at the time point t4 which is just before the end of a predetermined integration time, the output voltages S2 of the respective differential amplifiers 21 are sampled by the sampling circuit 40.

Then, right after the sampling is completed, the reset switch 21a of each of the differential amplifiers 21 is switched to ON, and thereafter the gate control signal for causing the switching elements 12b to be switched to OFF is outputted to the gate control signal line 13 from the gate driver 30, and each of the switching elements 12b is switched to OFF in response to the gate control signal.

Thereafter, in the sampling circuit 40, the output voltage S1 is subtracted from the output voltage S2 sampled in the manner as described above, and the resultant voltage is obtained as an analog image signal. Then, each of the differential amplifiers 21 is switched by the multiplexer 50 to input the analog image signals obtained in the manner as described above to the AD converter, where they are sequentially digitized and outputted as digital image signals.

Thereafter, the gate control signal is outputted from the gate driver 30 to the gate control signal lines 13 selectively and sequentially, and the reading process described above is repeated until digital image signals for the entire radiation image recording medium 10 is obtained.

According to the radiation image detector of the first embodiment of the present invention, a delay circuit 16 is provided for the switching element 12b of each of the charge detecting elements 12c to delay the rise time of the gate control signal, and the charge signals $Q_S$ flowed out to the charge signal lines 14 after the rise time are detected. This allows the noise signals $Q_N$ generated by the parasitic capacitors when outputting of the gate control signal is initiated to the gate control signal lines 13, and charge signals $Q_S$ stored in the storage sections 12a of the charge detecting elements 12c to flow through the charge signal lines 14 at different timings. Accordingly, the charge signals $Q_S$ free from the noise signals $Q_N$ may be detected.

Hereinafter, a second embodiment of the radiation image detector of the present invention will be described.

The radiation image detector according to the second embodiment includes a radiation image recording medium 70 having a charge generating layer 11 for generating charges by receiving radiation, and a charge detecting layer 72 for storing the charges generated in the charge generating layer 11; and a detecting section 25, which will be described later, for detecting charge signals flowed out from the radiation image recording medium 70. The second embodiment differs from the first embodiment in the configuration of the charge detecting layer 72 of the charge detecting layer 70, and the gate driver 35 of the detecting section 25.

Figure 5:
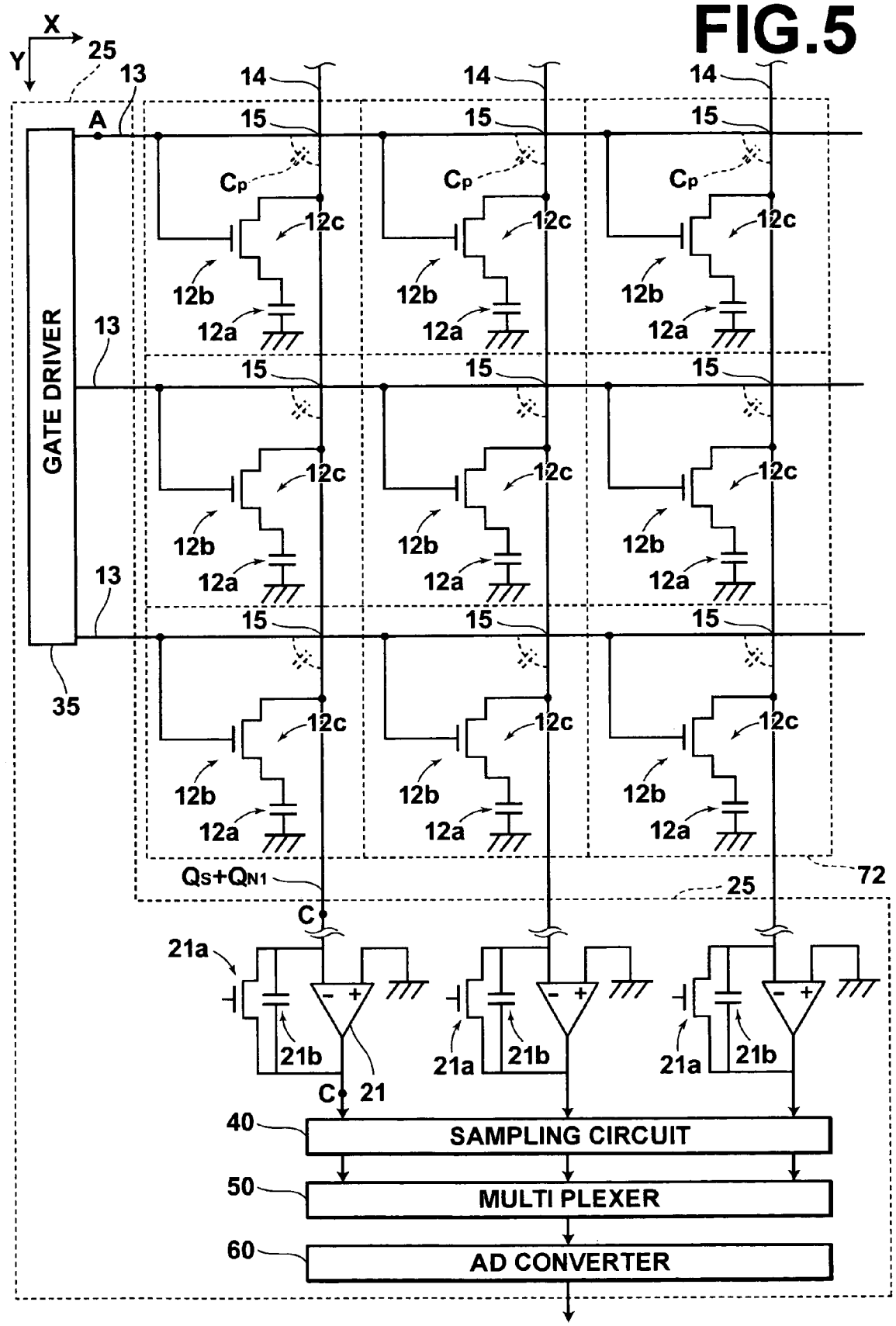
FIG. 5 is a schematic diagram of the detecting section and the charge detecting layer of the radiation image recording medium according to the second embodiment of the radiation image detector of the present invention, illustrating the configuration thereof.

As shown in FIG. 5, the charge detecting layer 72 of the radiation image recording medium 70 according to the second embodiment has no delay circuit 16 as are installed in the first embodiment.

Further, the gate driver 35 of the detecting section 25 of the radiation image detector according to the second embodiment is constructed to output the gate control signal to each of the gate control signal lines 13 of the radiation image recording medium 70 selectively and sequentially, and to output a gate control signal for controlling the switching elements 12b ON and OFF within the integration time of the differential amplifiers 21. The operation of the gate driver 35 will be described later.

In FIG. 5, components having the same reference numerals are identical to those used in the first embodiment.

Figure 6:
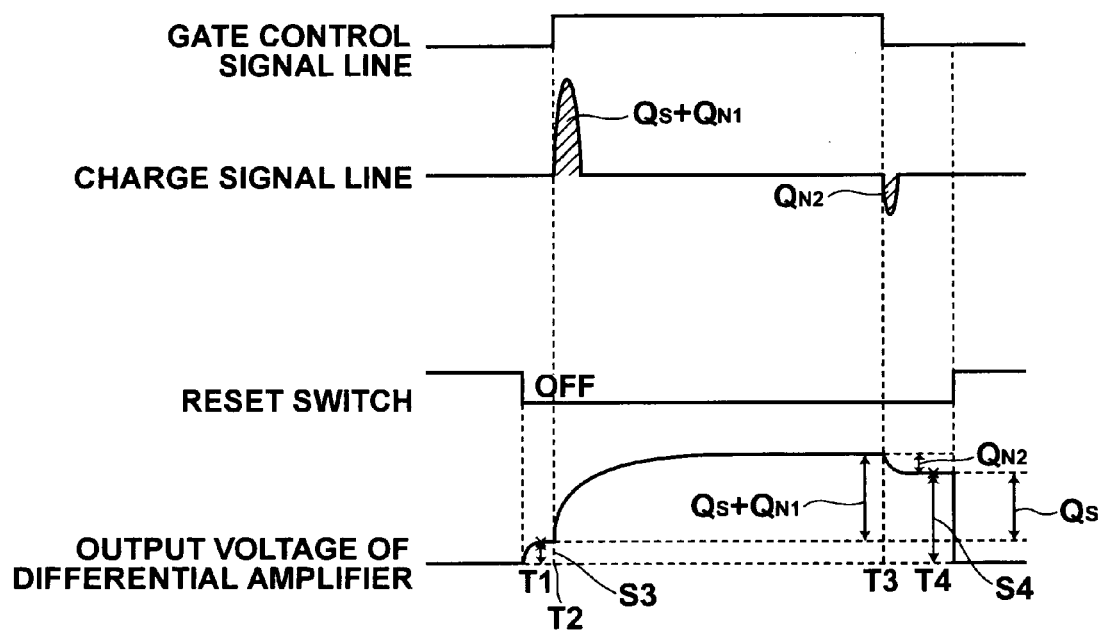
FIG. 6 is a timing chart for explaining the operation of the radiation image detector according to the second embodiment.

Hereinafter, the reading process for reading out a radiation image from the radiation image detector according to the second embodiment of the present invention will be described with reference to a timing chart shown in FIG. 6. In FIG. 6, the voltage waveform on the gate control signal line is the voltage waveform at point A, that on the charge signal line is the voltage waveform at point C, and that of the output voltage of the differential amplifier is the voltage waveform at point D in FIG. 5 respectively. Further, the recording process for recording a radiation image on the radiation image detector of the second embodiment is identical to that for recording a radiation image on the radiation image detector of the first embodiment.

When reading out the radiation image from the radiation image detector according to the second embodiment, initially, the reset switch 21a of each of the differential amplifiers 21 is switched to OFF to initiate the integration as illustrated in the timing chart shown in FIG. 6. At the time point T1, which is right after the reset switch is switched to OFF, output voltages S3 outputted from the respective differential amplifiers 21 are sampled by the sampling circuit 40. At the time point T2, which is right after the time point T1, the gate control signal for causing the switching elements 12b to be switched to ON is outputted to one of the gate control signal lines 13 from the gate driver 35. More specifically, the gate control signal for causing the switching elements 12b to be switched to ON is a rising voltage signal as shown in FIG. 6. Then, the switching element 12b of each of the charge detecting elements 12c connected to the gate control signal line 13 is switched to ON in response to the gate control signal, and the charge signals $Q_S$ stored in the storage sections 12a of the charge detecting elements 12c are outputted to the respective charge signal lines 14 connected to the respective storage sections 12a.

Here, when the gate control signal is outputted to one of the gate control signal lines 13 from the gate driver 35 as described above, a noise signal $Q_{N1}$ flows out to each of the charge signal lines 14 from each of the parasitic capacitors $C_P$ formed in the vicinity of the intersection 15 between the gate control signal line 13 and each of the charge signal lines 14, as well as the charge signal $Q_S$ from the storage section 12a. That is, the composite signal of the charge signal $Q_S$ and noise signal $Q_{N1}$ flows out to each of the charge signal lines 14. In particular, the noise signal $Q_{N1}$ becomes comparatively large when compared with the charge signal $Q_S$ from a low radiation area, which needs to be eliminated in order to obtain an acceptable image signal.

In the radiation image detector according to the second embodiment, the gate control signal for causing the switching elements 12b to be switched to OFF is outputted to each of the gate control signal lines 13 from the gate driver 35 at the time point T3 which is within the integration time of each of the differential amplifiers 21, in order to eliminate the noise signals $Q_{N1}$ as shown in FIG. 6. The gate control signal for causing the switching elements 12b to be switched to OFF specifically means a falling voltage signal as shown in FIG. 6. When the falling voltage signal is outputted to one of the gate control signal lines 13 in the manner as described above, a noise compensation signal $Q_{N2}$ having the opposite polarity to that of the noise signal $Q_{N1}$ is generated by each of the parasitic capacitors $C_P$ formed in the vicinity of the intersection between the gate control signal line 13 and each of the charge signal lines 14, which also flows out to the charge signal lines 14. If the falling voltage signal is equal to the rising voltage signal in magnitude, it may be generally said that $Q_{N2}=-Q_{N1}$. The noise compensation signal $Q_{N2}$ having the opposite polarity to that of the noise signal $Q_{N1}$ is also integrated by each of the differential amplifiers 21 and the output voltage of the differential amplifier 21 becomes smaller by that much. That is, the noise signals $Q_{N1}$ are eliminated in effect by including the noise compensation signal $Q_{N2}$ having the opposite polarity to that of the noise signal $Q_{N1}$ in the integration by each of the differential amplifiers 21.

Thus, the result is that the charge signal $Q_S$ without the noise signal $Q_{N1}$ is integrated by each of the differential amplifiers 21, then at the time point T4, which is just before the end of the predetermined integration time, the output voltages S4 of the respective differential amplifiers 21 are sampled by the sampling circuit 40, and the reset switch 21a of each of the differential amplifiers 21 is switched to ON right after the sampling.

Thereafter, the gate control signal is outputted from the gate driver 35 to the gate control signal lines 13 selectively and sequentially, and the reading process described above is repeated until digital image signals for the entire radiation image recording medium 70 is obtained.

In the radiation image detector according to the second embodiment, the noise compensation signals $Q_{N2}$ are generated through the gate control signal for causing the switching elements 12b to be switched to OFF. The radiation image detector of the present invention is not limited to this. The detector may include a noise compensation output section constructed to output to each of the gate control signal lines 13 a reverse voltage signal having an opposite voltage direction to that of the voltage of the gate control signal for causing the switching elements 12b to be switched to ON separately from the gate control signal, and the noise compensation signals $Q_{N2}$ are generated by outputting the reverse voltage signal to the gate control signal lines 13. When the noise compensation output section described above is provided, the gate control signal for causing the switching elements 12b to be switched to OFF needs to be outputted to the gate control signal lines 13 after the integration is completed.

Further, in the radiation image detector according to the second embodiment, the gate control signal for causing the switching elements 12b to be switched to ON, and that for causing them to be switched to OFF have the same potential difference. But the radiation image detector of the present invention is not limited to this. If the amount of noise generated varies depending on the direction of the potential change of the gate control signal, the gate control signals may have different potential differences. For example, the potential of the gate control signal for causing the switching elements 12b to be switched to OFF may further be lowered.

What is claimed is:

1. A radiation image detector, comprising:
  (a) a radiation image recording medium, including:
   (1) a charge generating section for generating charges by receiving radiation carrying a radiation image;

(2) multitudes of charge detecting elements disposed two-dimensionally in orthogonal directions, each having a storage section for storing the charge generated in the charge generating section, and a switching element for reading out the charge signal stored in the storage section;

(3) multitudes of charge signal lines for receiving the charge signals flowing out from the storage sections, each of the charge signal lines being installed in parallel with each column of the charge detecting elements disposed in either direction of the orthogonal directions;

(4) multitudes of gate control signal lines for receiving a gate control signal for controlling the switching elements ON and OFF, each of the gate control signal lines being installed in parallel with each row of the charge detecting elements disposed in the other direction of the orthogonal directions; and (b) a detecting section for detecting the charge signals flowed out to the charge signal lines of the radiation image recording medium, wherein:

the radiation image recording medium further includes multitudes of delay circuits, each being provided for the switching element of each of the charge detecting elements, for delaying the rise time of the gate control signal for causing each of the switching elements to be switched to ON; and the detecting section is constructed to detect the charge signals flowed out to the charge signal lines after the rise time.

2. The radiation image detector according to claim 1, wherein the delay circuit is a low-pass filter circuit.

3. The radiation image detector according to claim 2, wherein the detecting section comprises:

a charge amplifier for integrating the charge signal flowed out to the charge signal line; and a correlated double sampling control section which is constructed:

to control the charge amplifier to initiate the integration after the gate control signal is outputted to the gate control signal line and before the end of the rise time;

to obtain a first signal which has been integrated by the charge amplifier during the time period from the initiation of the integration to a predetermined time point which is before the end of the rise time;

to obtain a second signal which has been integrated by the charge amplifier during the time period from the initiation of the integration to a time point which is just before the end of a predetermined integration time; and to obtain the difference between the second and first signals as an image signal of the radiation image.

4. The radiation image detector according to claim 1, wherein the detecting section comprises:

a charge amplifier for integrating the charge signal flowed out to the charge signal line; and a correlated double sampling control section which is constructed:

to control the charge amplifier to initiate the integration after the gate control signal is outputted to the gate control signal line and before the end of the rise time;

to obtain a first signal which has been integrated by the charge amplifier during the time period from the initiation of the integration to a predetermined time point which is before the end of the rise time;

to obtain a second signal which has been integrated by the charge amplifier during the time period from the initiation of the integration to a time point which is just before the end of a predetermined integration time; and to obtain the difference between the second and first signals as an image signal of the radiation image.

5. The radiation detector of claim 1, wherein the detecting section is constructed to only detect the charge signals flowed out to the charge signal lines after the rise time.

6. The radiation image detector according to claim 1, wherein the detecting section comprises:

a charge amplifier for integrating the charge signal flowed out to the charge signal line; and a correlated double sampling control section which is constructed:

to control the charge amplifier to initiate the integration after the gate control signal is outputted to the gate control signal line and before the end of the rise time;

to obtain a first integrated signal from the charge amplifier during the time period between the initiation of the integration to a predetermined time point before the end of the rise time;

to obtain a second integrated signal from the charge amplifier during the time period between the initiation of the integration and just before the end of a predetermined integration time; and to obtain an image signal from the difference between the first integrated signal and the second integrated signal.

7. A radiation image detector, comprising:

(a) a radiation image recording medium, including:

(1) a charge generating section for generating charges by receiving radiation carrying a radiation image;

(2) multitudes of charge detecting elements disposed two-dimensionally in orthogonal directions, each having a storage section for storing the charge generated in the charge generating section, and a switching element for reading out the charge signal stored in the storage section;

(3) multitudes of charge signal lines for receiving the charge signals flowing out from the storage sections, each of the charge signal lines being installed in parallel with each column of the charge detecting elements disposed in either direction of the orthogonal directions;

(4) multitudes of gate control signal lines for receiving a gate control signal for controlling the switching elements ON and OFF, each of the gate control signal lines being installed in parallel with each row of the charge detecting elements disposed in the other direction of the orthogonal directions; and (b) a detecting section, including:

(1) a gate control signal output section for outputting the gate control signal to the gate control signal lines; and (2) a charge amplifier for detecting an image signal of the radiation image by integrating the charge signal flowed out to the charge signal line; and (c) a noise compensation signal output section for outputting to each of the gate control signal lines a reverse voltage signal having an opposite voltage direction to that of the gate control signal for causing the switching elements to be switched to ON within the integration time for integrating the charge signal by the charge amplifier said radiation image detector further comprising a correlated double sampling control section which is constructed:

to obtain a first signal which has been integrated by the charge amplifier during the time period from the initiation of the integration by the charge amplifier to a first time point which is before the gate control signal for causing the switching element to be switched to ON is outputted;

to obtain a second signal which has been integrated by the charge amplifier during the time period from the initiation of the integration by the charge amplifier to a second time point which is after the reverse voltage signal is outputted and within the integration time; and to obtain the difference between the second and first signals as the image signal.

8. The radiation image detector according to claim 7, wherein the gate control signal output section further serves as the noise compensation signal output section and outputs the reverse voltage signal.

9. The radiation image detector according to claim 8, further comprising a correlated double sampling control section which is constructed:

to obtain a first signal which has been integrated by the charge amplifier during the time period from the initiation of the integration by the charge amplifier to a first time point which is before the gate control signal for causing the switching element to be switched to ON is outputted;

to obtain a second signal which has been integrated by the charge amplifier during the time period from the initiation of the integration by the charge amplifier to a second time point which is after the reverse voltage signal is outputted and within the integration time; and to obtain the difference between the second and first signals as the image signal.

10. The radiation detector of claim 7, wherein the noise compensation signal output section outputs the reverse voltage signal causing the switching elements to be switched to ON before the integration by the charge amplifier is completed.

\* \* \* \* \*